United States Patent
Wang

(10) Patent No.: US 11,750,138 B2
(45) Date of Patent: Sep. 5, 2023

(54) SYSTEM AND METHOD FOR POWER LINE COMMUNICATION TO CONTROL FANS

(71) Applicant: Focus Universal Inc., Ontario, CA (US)

(72) Inventor: Desheng Wang, Diamond Bar, CA (US)

(73) Assignee: Focus Universal Inc., Ontario, CA (US)

( * ) Notice: Subject to any disclaimer, the term of this patent is extended or adjusted under 35 U.S.C. 154(b) by 0 days.

(21) Appl. No.: 17/749,048

(22) Filed: May 19, 2022

(65) Prior Publication Data

US 2022/0376643 A1 Nov. 24, 2022

Related U.S. Application Data

(60) Provisional application No. 63/190,428, filed on May 19, 2021.

(51) Int. Cl.
| | |
|---|---|
| *H03K 5/01* | (2006.01) |
| *H02P 29/00* | (2016.01) |
| *F24F 11/00* | (2018.01) |
| *H03B 5/32* | (2006.01) |

(52) U.S. Cl.
CPC .......... *H02P 29/00* (2013.01); *F24F 11/0001* (2013.01); *H03K 5/01* (2013.01); *H03B 5/32* (2013.01)

(58) Field of Classification Search
CPC ......... H02P 29/00; H02P 5/46; F24F 11/0001; H03K 5/01; H03B 5/32; H03B 2200/0076; H04L 2012/285; H04L 12/2816; H04L 2012/2843; F04D 27/004

USPC .......................................................... 307/31
See application file for complete search history.

(56) References Cited

U.S. PATENT DOCUMENTS

| | | | |
|---|---|---|---|
| 3,973,240 A | 8/1976 | Fong | |
| 4,479,215 A | 10/1984 | Baker | |
| 5,264,823 A | 11/1993 | Stevens | |
| 6,329,905 B1 * | 12/2001 | Cunningham | ........... H04B 3/54 375/273 |
| 6,608,552 B1 * | 8/2003 | Fogel | ................... H05B 47/185 375/267 |
| 7,076,378 B1 * | 7/2006 | Huebner | .................. H04B 3/54 333/236 |
| 7,800,491 B2 | 9/2010 | Kodama et al. | |
| 7,962,118 B2 | 6/2011 | Schwager et al. | |
| 8,072,323 B2 | 12/2011 | Kodama et al. | |
| 8,209,677 B2 * | 6/2012 | Shintani | ............. H04L 12/2814 717/172 |
| 8,693,605 B2 | 4/2014 | Wolter et al. | |
| 8,907,529 B2 | 12/2014 | Hyde et al. | |
| 9,214,985 B2 | 12/2015 | Wolter et al. | |
| 9,276,633 B2 * | 3/2016 | Chen | ..................... H04B 3/542 |

(Continued)

*Primary Examiner* — Ryan Jager
(74) *Attorney, Agent, or Firm* — Knobbe, Martens, Olson & Bear, LLP

(57) ABSTRACT

Disclosed is a system and method for power line control of electrical fans. The system generates a sinusoidal wave using a crystal oscillator. Control information is added to the sinusoidal wave by routing the wave through a phase inversion circuit a predetermined intervals according to a protocol. The resulting control signal is sent on a power line. The control signal is received using a crystal filter, decoded and converted to executable instructions for controlling a fan motor.

20 Claims, 3 Drawing Sheets

(56) References Cited

U.S. PATENT DOCUMENTS

| | | | | |
|---|---|---|---|---|
| 11,546,017 B2* | 1/2023 | Wang | ........................ | H04B 3/54 |
| 2022/0286161 A1* | 9/2022 | Wang | ........................ | H04B 3/54 |
| 2022/0376643 A1* | 11/2022 | Wang | .................... | F24F 11/0001 |
| 2022/0376942 A1* | 11/2022 | Wang | ....................... | G05B 15/02 |
| 2022/0377842 A1* | 11/2022 | Wang | ....................... | H04W 4/70 |
| 2023/0007755 A1* | 1/2023 | Wang | .................... | H05B 47/105 |

\* cited by examiner

SYSTEM AND METHOD FOR POWER LINE COMMUNICATION TO CONTROL FANS

CROSS-REFERENCE TO RELATED APPLICATIONS

The present application claims the benefit of priority to U.S. Provisional Patent Application No. 63/190,428, filed May 19, 2021, the disclosure of which is hereby incorporated by reference in its entirety. Any and all applications for which a foreign or domestic priority claim is identified in the Application Data Sheet as filed with the present application are hereby incorporated by reference under 37 CFR 1.57.

FIELD

The present invention relates to a system and method of power line control of industrial fans.

BACKGROUND

Power line control (PLC) of devices is a well-known technology. Power companies have used it since the first half of the twentieth century for telemetry and other uses. The technology was adapted for use within commercial and home settings in the 1970s with the development of X10. X10 combined hardware, including transmitters and receivers, with a new transmission protocol. The system generated 120 kHz bursts at the zero crossings of the alternating current power wave. X10 suffered from several drawbacks, primary among which was an inability to deal with the noise on power lines, the noise being introduced by devices connected to those lines for power. X10 also has distance limitations and an inability to cross terminals which change the phase of the power signal.

More recently, digital technology has been brought to bear on PLC. In 1999, the Universal Power-line Bus (UPB) was introduced. UPB uses pulse-position modulation. Essentially, pulse-position modulation is a form of amplitude modulation. In pulse-position modulation, a pulse may be generated by the discharge of a capacitor in one of four positions in a frame placed toward the end of every half cycle of the AC power wave. The position of pulse indicates a value from zero to three. This protocol is capable of generating two bits every cycle, and a byte every two cycles. Messages in the protocol can be from 7 to 25 bytes. A major advantage of UPB was that the messaging protocol of UPB allowed for the "linking" of devices. With "linking" a single message could be sent, and the message could include different commands, or the same command, for each device in the link. In this way, lighting could be adjusted to a particular scheme with one touch of a control.

UPB pulses are relatively weak in comparison to the AC power signal on the power line. Certain devices or appliances generate electrical noise in the same range as the power signal, which interferes with the PPM of the UPB system. One such device is a fan, which generates as much or more noise than most devices. The main source of electrical noise in a fan is the commutator brushes, which can bounce as the motor shaft rotates. This bouncing, when coupled with the inductance of the motor coils and motor leads, can lead to a lot of noise on the power line and can even induce noise in nearby lines. This noise can interfere with system sensors and can even impair the system microcontroller by causing voltage dips on the regulated power line. Large enough voltage dips can corrupt the data in microcontroller registers or cause the microcontroller to reset.

A number of potential solutions to the noise generated by fan motors and other devices have been proposed and implemented. Among these are adding capacitors either across the motor terminals, or from each motor terminal to the case, for grounding, keeping motor power leads short, and introducing filtering circuits. The filtering circuits may be plugged in to an outlet or hard wired in at an electrical panel. Each of these solutions either generates further problems that must be solved or is costly to implement in both equipment and labor.

Given the identified problems, one proposed solution is to connect the fans with a separate cable, for example, an RJ12 cable, which carries a control signal. However, such an arrangement defeats the purpose of using PLC in the first place. PLC takes advantage of the fact that the power line wiring which is also used as a signal carrier line with PLC, is already in place, and no additional lines need to be installed.

For the foregoing reasons, there is a need for a system which can send PLC messages to devices on a network despite the network containing fans which generate noise.

SUMMARY

Disclosed is a system for controlling devices via power line control. The system may include a controller adapted to send commands based on a user's operation of the controller. The system may further include an emitter electrically connected to the controller. The emitter itself may include a crystal oscillator, the crystal oscillator may be powered to transmit a signal at a transmission frequency, a switch electrically may be connected to the crystal oscillator, the switch may be adapted to operate at an open and closed cycle of at least fifty times the frequency of the crystal oscillator, a phase inversion circuit may be electrically connected to a first side of the switch, a bypass may be electrically connected to a second side of the switch, an output may be electrically connected to both the phase inversion circuit and the bypass, a first processor may be electrically connected to the switch, the first processor may be adapted to execute commands sent by the controller in order to operate the switch, and a first memory may be electrically connected to the processor, the first memory having a protocol stored on it. A power line may be electrically connected to the output, the power line carrying standardized electrical power of at least 100V and at least 40 Hz. The system may include one or more electrical outlets which may be electrically connected to the power line. The system may further include one or more smart fans, one smart fan electrically connected to each of the one or more electrical outlets. The one or more smart fans may include a receiver including a crystal filter which may be tuned to filter out all signals on the power line other than a band centered around the transmission frequency. The smart fan may also include a second memory which may contain the protocol, and a second processor which may be electrically connected to the second memory and the receiver. The second processor may be adapted to execute the protocol based on the signal. In operation of the system, when commands are sent from the controller, the first processor may operate the switch according to the protocol, adding phase inversion spikes to the signal. The signal with the phase inverted spikes may be received by the receiver on the one or more smart fans and may be analyzed according to the protocol in order to operate the one or more smart fans.

Further disclosed is a method for controlling a fan with power line control. The method may include generating a sinusoidal wave using a crystal oscillator. The method may further include forming a control signal by using a switch which may route the sinusoidal wave through a phase inversion circuit and back to a bypass. Such routing may form phase inversion spikes at predetermined intervals on the sinusoidal wave according to a protocol. The method may further include outputting the control signal to a power line, and then receiving the control signal on a crystal filter which may be electrically connected to the power line. The method may further include converting the control signal to executable instructions using the protocol, and the converted control signal may control the operation of a fan motor.

Further disclosed in an additional system for providing power line control. The system may include a controller which may be adapted to send commands, an emitter which may be electrically connected to the controller. The emitter may include a crystal oscillator which may emit a sinusoidal wave, a switch which may be electrically connected on a first end to the crystal oscillator and may be electrically connected on a first side of a second end to a bypass and may be electrically connected on a second side of the second end to a phase inversion circuit. The emitter may further include a first memory containing a protocol, a first processor which may be electrically connected to the switch and the first memory. The first processor may be adapted to execute the protocol according to the commands from the controller. Finally, the emitter may also include an output. The system may further include a power line connected to the output, and at least one smart fan which may be electrically connected to the power line. The at least one smart fan may include a crystal filter, a second processor which may be electrically connected to the crystal filter and a fan motor, and a second memory which may be electrically connected to the second processor. The second memory may contain the protocol. When the system is operated, a user may manipulate the controller to send a command. Then, the protocol, executing on the first processor, may convert the command to instructions to operate the switch, which may encode the sinusoidal wave with control information in the form of phase inversion spikes and spacing between the spikes. The sinusoidal wave with control information may be output to the power line and may be received at the crystal filter, analyzed by the protocol executed on the second processor, and may be converted to control signals for controlling the fan motor.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
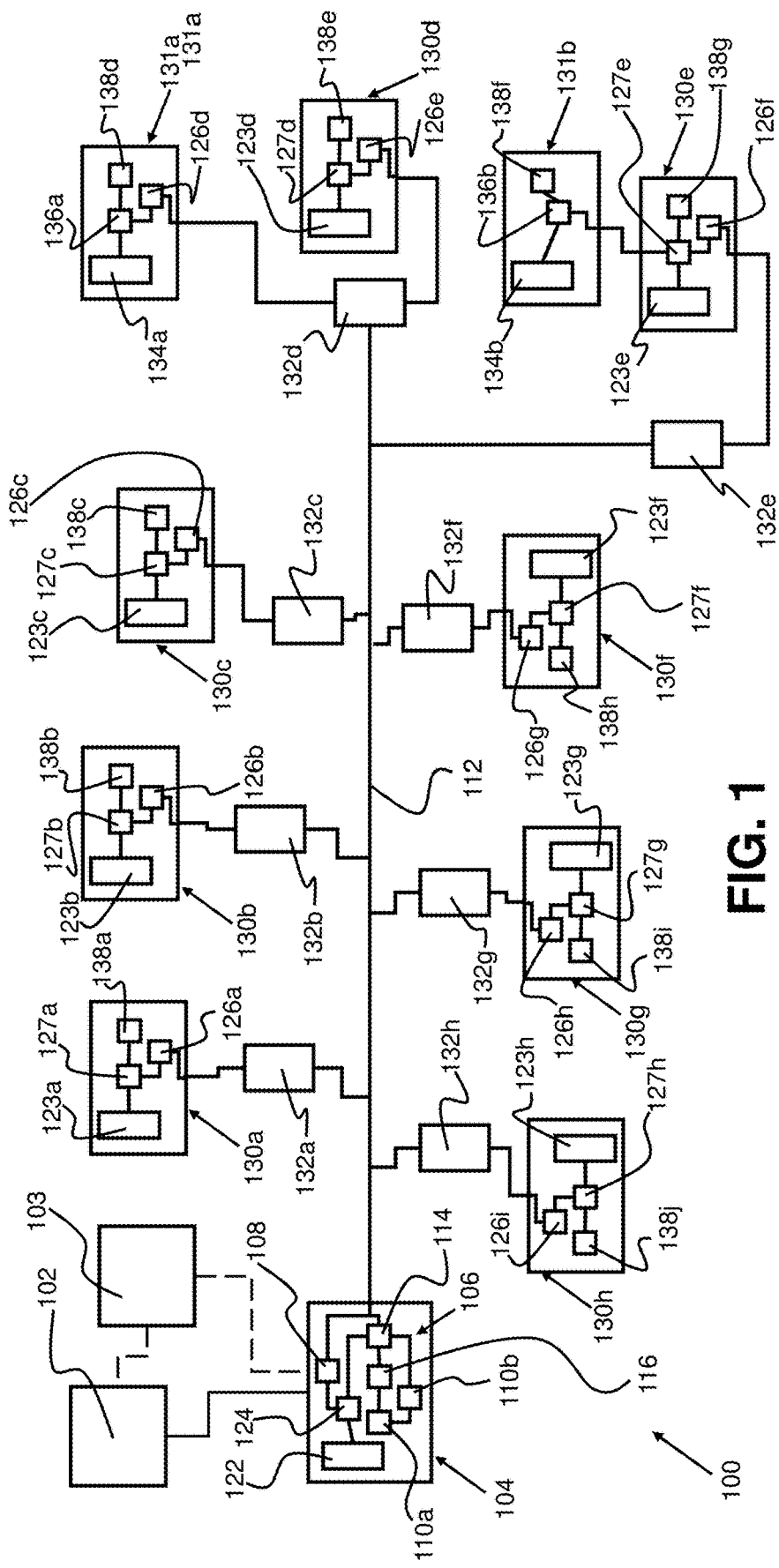
FIG. 1 shows a schematic diagram of the PLC system.

The detailed description set forth below in connection with the appended drawings is intended as a description of the presently preferred embodiment of system and method to transmit commands and data between an external device or application and a translator application on a computing device using text language protocol, and is not intended to represent the only form in which it can be developed or utilized. The description sets forth the functions for developing and operating the system in connection with the illustrated embodiments. It is to be understood, however, that the same or equivalent functions may be accomplished by different embodiments that are also intended to be encompassed within the scope of the present disclosure. It is further understood that the use of relational terms such as first, second, distal, proximal, and the like are used solely to distinguish one from another entity without necessarily requiring or implying any actual such relationship or order between such entities.

Disclosed is a system and method to control devices via power line control (PLC). Although the system and method may be applied to any device, this disclosure concentrates on electric fans for the reason that fans are often difficult to control with PLC due to the amount of electrical noise that fans generate in the power line. The system may include a controller, an emitter, a power line, one or more outlets, and one or more smart fans. In some embodiments, the controller and emitter may be integrated in a single unit.

The controller is electrically connected to the emitter, which is, in turn, connected to the power line. The power line may be connected to one or more conventional outlets for providing power to electronic devices. Each of the one or more outlets may have one or more sockets. One smart fan may plug in to one of the one or more sockets of each of the one or more outlets, thereby electrically connecting the smart fan to the power line.

A sinusoidal wave is generated by the emitter. To generate the sinusoidal wave, power may be applied to a crystal oscillator. The crystal oscillator generates a constant sinusoidal wave in the high kHz (e.g., 250-1000 kHz) to MHz (2-8 MHz) range and with a high Q factor.

A user may then manipulate the controller to cause information to be sent to a processor executing a protocol. According to the protocol, the processor converts the information from the controller in to control information to be encoded on the sinusoidal wave. In order to encode control information on the sinusoidal wave, the processor, according to the protocol, cycles a switch which routes the sinusoidal wave through either a phase inversion circuit or through a bypass. When the signal is routed through the phase inversion circuit and then rapidly returned to the bypass, a momentary phase inversion, or phase inversion spike, in the sinusoidal wave is created. The timing of the switching, and thereby the creation and spacing of the phase inversion spikes, is done according to command information sent from the controller and then converted by the protocol. The resulting signal with the added control information, called a control signal, is sent through the power line.

Once the control signal is output to a power line, the control signal travels the extent of that power line and any connected power lines. That is, the control signal will continue on the power line to every terminal in a structure, or even beyond a structure, depending on the design of the power system and the PLC system. In this way, the control signal is broadcast on the power line.

On the receiving end, a smart fan may be plugged in to a socket of the one or more outlets. This electrically connects the smart fan to the power line, and allows the smart fan to receive both the power signal and the control signal. On the smart fan, a crystal filter electrically connected to the power line filters out a bandwidth of 500 Hz or less centered on the transmission frequency of the crystal oscillator, and band passes the remaining power line signal. Once the control signal is received, the control signal is sent to a processor for analysis by the protocol, which is stored on a memory. According to the protocol, a determination is made if the control signal was directed to the smart fan analyzing the control signal, if not, the control signal is ignored. If the control signal is directed to the smart fan, the protocol, executing on a processor converts the control signal in to executable instructions for controlling a fan motor on the smart fan.

Using this protocol, a single controller and emitter combination can control multiple individual smart fans on the system without being affected by the electronic noise produced by the smart fan on the power line.

More specifically, as shown in FIG. 1, the system 100 may include a controller 102. The controller 102 may be electrically connected to an emitter 104. The controller 102 may be a programmable logic controller which is connected to the emitter 104 via a wired connection, for example, a low voltage wired connection as is well known in the art. Alternatively, the emitter 104 and the controller 102 may be integrated in to a single housing. Alternatively, or in addition, the controller 102 may allow for control functionality to be passed to an external device. For example, a software package available for personal computers running operating systems such as Microsoft® Windows®, Mac® OS, Unix, Linux, etc. This can allow a user to use a standard computer as an extension of the controller 102. Optionally, a user can use a mobile computing device as an extension of, or in place of, the controller 102. For example, Android®, iOS®, and Windows® based mobile computing devices, such as smart phones and tablets can be used as an extension of, or in place of, the controller 102. A user can install an Application onto their mobile computing device. The Application, can allow the mobile computing device to function as an extension of, or in place of, the controller 102.

A touch screen on the controller 102 may be used as a system interface by a user (not shown). Certain commands which may be executed by the protocol may be indicated by visual representations on the touch screen. For example, the commands may be indicated by icons or text, or a combination of both. When a user touches the portion of the screen with the visual representation, a command is sent in a message to the processor in the emitter 104, which interprets the command using the protocol.

The emitter 104 is a transceiver. The primary function of the emitter 104 is to send signals as directed by the controller 102. The transmitter portion 106 of the transceiver sends a control signal upon which control information is encoded. The receiver portion 108 of the transceiver receives data signals from the smart fans. For example, the smart fans 130a-k may send acknowledgements of messages or self-identification information to the emitter 104.

A transmitter portion 106 of the emitter includes a crystal oscillator circuit 110. The crystal oscillator circuit 110 draws power from the power line 112. The power is taken from the power line 112 and transformed down from about 110V to about 0.1V. In a circuit providing 10 amps of current on the power line 112, a 0.1V of transformed voltage produces one watt of power for the crystal oscillator circuit 110. The power can be applied to a crystal oscillator which can produce a sinusoidal signal. The signal produced by the crystal oscillator is amplified by an amplifier and the resulting signal is both transmitted from and fed back in to the crystal oscillator. As long as the crystal oscillator receives power, the crystal oscillator will continue to output the wave signal.

Crystal oscillators emit a sinusoidal wave at a frequency determined by their physical structure. Crystal oscillators, and particularly quartz crystal oscillators, have a very high Q value. Quartz crystal oscillators are capable of primary frequencies in the high kHz up the MHz range. Also, as indicated by the high Q value, they have a narrow bandwidth. A typical Q value for a quartz oscillator ranges from $10^4$ to $10^6$, compared to perhaps $10^2$ for an inductor and capacitor, or LC, oscillator. The maximum Q for a high stability quartz oscillator can be estimated as $Q=1.6\times10^7/f$, where f is the resonant frequency in megahertz. The purer the crystal, the higher the Q value, as imperfections, which are measured in parts per million, cause the bandwidth to spread. At some point the cost to reduce the imperfections in parts per million during creation of the crystal no longer justifies the resulting performance increase. Thus, crystal oscillators with imperfections in the range of 50 parts per million (PPM) to 0 PPM of imperfections are contemplated, with imperfections in the range of 35 PPM to 2 PPM being preferred.

Another important aspect of quartz crystal oscillators in light of the disclosure is that crystal oscillators exhibit very low phase noise. In many oscillators, any spectral energy at the resonant frequency is amplified by the oscillator, resulting in a collection of tones at different phases. In a crystal oscillator, the crystal generally vibrates on one axis, therefore only one phase is dominant. Low phase noise makes crystal oscillators particularly useful in applications requiring stable signals and very precise time references.

A quartz crystal provides both series and parallel resonance. The series resonance is a few kilohertz lower than the parallel resonance. Crystals below 30 MHz are generally operated between series and parallel resonance, which means that the crystal appears as an inductive reactance in operation, this inductance forming a parallel resonant circuit with externally connected parallel capacitance. Any small additional capacitance in parallel with the crystal pulls the frequency lower. Moreover, the effective inductive reactance of the crystal can be reduced by adding a capacitor in series with the crystal. This latter technique can provide a useful method of trimming the oscillatory frequency within a narrow range; in this case inserting a capacitor in series with the crystal raises the frequency of oscillation. For a crystal to operate at its specified frequency, the electronic circuit may need to be exactly the one specified by the crystal manufacturer. Note that these points imply a subtlety concerning crystal oscillators in this frequency range: the crystal does not usually oscillate at precisely either of its resonant frequencies.

Crystals above 30 MHz (up to >200 MHz) are generally operated at series resonance where the impedance appears at its minimum and equal to the series resistance. For these crystals the series resistance is specified (<100Ω) instead of the parallel capacitance. To reach higher frequencies, a crystal can be made to vibrate at one of its overtone modes, which occur near multiples of the fundamental resonant frequency. Only odd numbered overtones are used. Such a crystal is referred to as a 3rd, 5th, or even 7th overtone crystal. To accomplish this, the oscillator circuit usually includes additional LC circuits to select the desired overtone.

The signal created by the crystal oscillator circuit 110 is next routed to a switch 114. The switch 114 may be a fast switching operation, as is well known in the art, or any other switch which is able to provide fast enough switching, including transistors which may act as switches by having a voltage applied to the base, or having the voltage disconnected. The switch may have a common which receives the sinusoidal wave from the crystal oscillation circuit, and on the opposite side of the switch, a first terminal and a second terminal. Connected to the first terminal of the switch 114 is a phase inversion circuit 116. Connected to the second terminal of the switch 114 is a bypass 118. The speed of the switch 114 allows for very rapid alternation between the bypass and the phase inversion circuit. By way of example and not limitation, the switch 116 may cycle fast enough to switch 100 times from the bypass to the phase inversion circuit and back to the bypass in a single cycle of a 20 MHz signal. Thus, there is an opportunity, depending on the protocol used by the system, to send 100 bits of information in a single 20 MHz cycle, all without interference by noise. In this example, the system could generate 2 billion bits of information a second. Alternatively, the switch may cycle fewer than 100 times in a 20 MHz cycle, or more than 100 times in a 20 MHz cycle. Still further alternatively, the crystal oscillator may generate a sinusoidal wave at more than 20 MHz or less than 20 MHz. The operation of the system, including the creation and modification of the sinusoidal wave produced by crystal oscillator is discussed in detail below. The transmission portion 106 is electrically connected to an emitter output 120, which is in turn connected to the power line 112.

The emitter 104 may include a memory 122 on which a protocol is stored, and a processor 124, which is electrically connected to the memory, and on which the protocol is executed. The protocol may include a portion which interprets commands sent by the controller 102, or from a transceiver 126a-k in a smart fan 130a-k. The protocol, executed by the processor 124, accomplishes the encoding of the sinusoidal wave of the crystal oscillator circuit by controlling the switch 114.

The protocol is designed so that messages include an identifier as to which smart fan 130a-k the message is directed. If a message is not directed to a particular smart fan 130a-k, that device ignores the message.

The power line may carry standard North American domestic power. That is, 120 V nominal, 60 Hz electrical power. As noted previously, in addition to the power signal, the power line may have electronic noise on it from one or more sources. The power line may be carrying single phase or three phase power. If the three phase conductors are split to provide single phase operation, the system still functions, because the output routes the control signal to each of the conductor wires on a three-phase system. Because of the large separation of frequencies between the control signal and the power line signal, the control signal and power signal do not interact. Once the control signal is output to a power line, the control signal travels the extent of that power line, and any connected power lines. That is, the control signal will continue on the power lines to every terminal in a structure, or even beyond a structure, depending on the design of the power system and the PLC system. In this way, the control signal is broadcast on the power line or lines. Additional details about PLC is provided in International Patent Application Publication No. WO 2021/107961, which is hereby incorporated by reference herein for all purposes.

One or more smart fans 130a-k may be connected to the power line 112. In FIG. 1, 11 smart fans 130a-k are shown, but it will be understood that there could be fewer than 11 smart fans, and more than 11 smart fans. The smart fans 130a-k include a standard plug (not shown) for connecting the smart fan 130a-k to a conventional outlet socket 132a-k on a conventional outlet. Thus, the conventional outlet socket 132a-k is electrically connected to the power line 112. The smart fans 130a-k further include a receiver to receive the control signal from the emitter, a processor for executing the protocol, a memory for storing the protocol, and a transmitter for sending both self-identification information, and acknowledgement messages to the emitter, and a transformer taking power from the power line for powering the smart portion of the smart fan, specifically the transceiver and the memory and processor which executes the protocol.

The transceiver 126a-k in the smart fan 130a-k uses a crystal filter to receive control signals sent over the power line. Just as with the crystal oscillator in the emitter 104, the crystal filter has a very high Q factor. The crystal's stability and its high Q factor allow crystal filters to have precise center frequencies and steep band-pass characteristics. Typical crystal filter attenuation in the band-pass is approximately 2-3 dB. Thus, the crystal filter only captures frequencies in an ultra-narrow band centered on the frequency produced by the crystal oscillator circuit 110, and allows the rest of the signal on the power line to pass. Thus, the power signal on the power line may be routed to other components in the fan to provide power.

This configuration of the crystal oscillator in the emitter 104 and crystal filter in the transceiver 126a-k of the smart fan 130a-k plays a large role in eliminating noise. As noted above, noise has been a problem which prohibits, at least in some cases, the use of power line control. Fans are known to generate more electronic noise than many appliances or other electrical devices, if not the most electric noise of any type of device. First, the frequency at which the configuration operates is relatively high for a power line. Most power lines noise is not generated at the frequency of the control signal. In the case that the noise does reach the frequency of the control signal, the noise would have to be nearly equal to, or equal to, the power of the control signal to compete in the ultra-narrow bandwidth. With the one watt transmission power spread across a very small bandwidth, the control signal can compete with, if not outright overmatch, most noise.

Another benefit is the distance over which the control signals of the disclosed system can be transmitted. Because the energy of the control signal is spread across a much narrower bandwidth, the control signal does not suffer from attenuation in the way that a broader bandwidth signal with the same energy would. As a result, the signal is able to travel over a longer distance than a similarly powered signal with a greater bandwidth.

Such an emitter 104 and smart fan 130a-k configuration has still further advantages. Because the system 100 operates on such a narrow bandwidth, the system does not interfere with other devices or systems. Moreover, because of the placement in the spectrum, there are very few devices with which the system 100 can interfere. Thus, the system 100 is not only able to deal with even some of the worst noise found on most power lines 112, but is further able to avoid interfering with other systems because the system 100 operates on an ultra-narrow bandwidth.

As noted above, the emitter 104 includes both a transmitter portion 106, and a receiver 108. The transmitter portion 106 includes the combination of the crystal oscillation circuit 110, the switch 114, the phase inversion circuit 116, and the bypass. Thus, the emitter 104, includes a transceiver. The receiver 108 of the emitter 104 is the same as that described for the smart fan 130a-k. Further, the transmitter on the smart fan transceiver 126a-k is the same as the transmitter portion 106 described for the emitter 104. The transceiver 126a-k on the smart fan 130a-k may be used to send acknowledgements of commands sent to the smart fan 130a-k back to the emitter 104 or controller 102, or both. The receiver 108 on the emitter 104 may be used to receive identification information from the smart fans 130a-k which are electrically connected to the emitter 104, the controller 102, or both. Further, the receiver 108 on the emitter 104 may be used to receive the acknowledgements from the smart fans 130a-k.

In operation, after the controller 102 is powered up, woken up from sleep mode, or connected via a wired or wireless connection to the emitter 104, the controller 102 may interrogate the smart fans 130a-k electrically connected to the power line 112. This is done by the controller 102 sending a command asking the smart fans 130a-k to provide identification information. If a controller 102 is already connected, the protocol may require that a smart fan 130a-k, which is later connected to the system 100 to send self-identification information to the emitter 104 through the power line 112 and on to the controller 102 through either the wired or wireless connection.

Because the controller 102 is able to identify each smart fan 130a-k connected individually, future commands may be specified as being for a particular smart fan 130a-k. Because these commands contain information identifying the smart fan 130a-k to which they are directed, the commands will be ignored by other smart fans 130a-k. Using this aspect of the protocol, each smart fan 130a-k can be controlled separately. Alternatively, some or all of the smart fans 130a-k could be specified by a command. Thus, groups of smart fans, for example, a group of smart fans in a specified area of a structure, may be controlled as a group. Or, if, for example, all fans need to be powered down, this can also be accomplished through the above identification of all smart fans 130a-k. In fact, there may be a particular identifier in the protocol specifying that a command is for all smart fans 130a-k. This prevents the protocol from requiring that each smart fan 130a-k have an individual identifier separately listed in a command.

In order to send commands to one or more smart fans 130a-k, commands from the controller 102 are converted to control signals by the protocol. The control signal has two parts. The first part is the sinusoidal wave, which the crystal oscillation circuit generates continuously, as shown in Step 410 on FIG. 2. The second part is control information which is encoded on the sinusoidal wave, which is shown in Step 420 of FIG. 2. After generation, the sinusoidal wave is fed to the connected switch 114, as is described above. The switch 114 is also connected to a processor 124 which executes the protocol. Based on the command signals from the controller, which are converted by the processor using the protocol, the processor 124 directs the switch 114 to switch between the phase inversion circuit 116 and the bypass 118. Information is encoded on the sinusoidal waveform generated by the crystal oscillator circuit 110 by switching the switch 114 from the bypass 118 to the phase inversion circuit 114 and back to the bypass 118 in order to create phase inversion spikes at defined intervals on the sinusoidal wave. The phase inversion spikes and their spacing represent control information which may be decoded by the protocol. The sinusoidal wave combined with the control information may be called a control signal.

When the control information is added to the sinusoidal wave to create the control signal, the amplitude and frequency of the sinusoidal wave may be unaffected. Rather, only the phase is changed in creating the phase inversion spikes. Thus, the control signal is output to the power line with the frequency unaffected from when the sinusoidal wave was generated by the crystal oscillator. Also, the amplitude is not changed, as the only amplification takes place within the crystal oscillation circuit.

Figure 2:
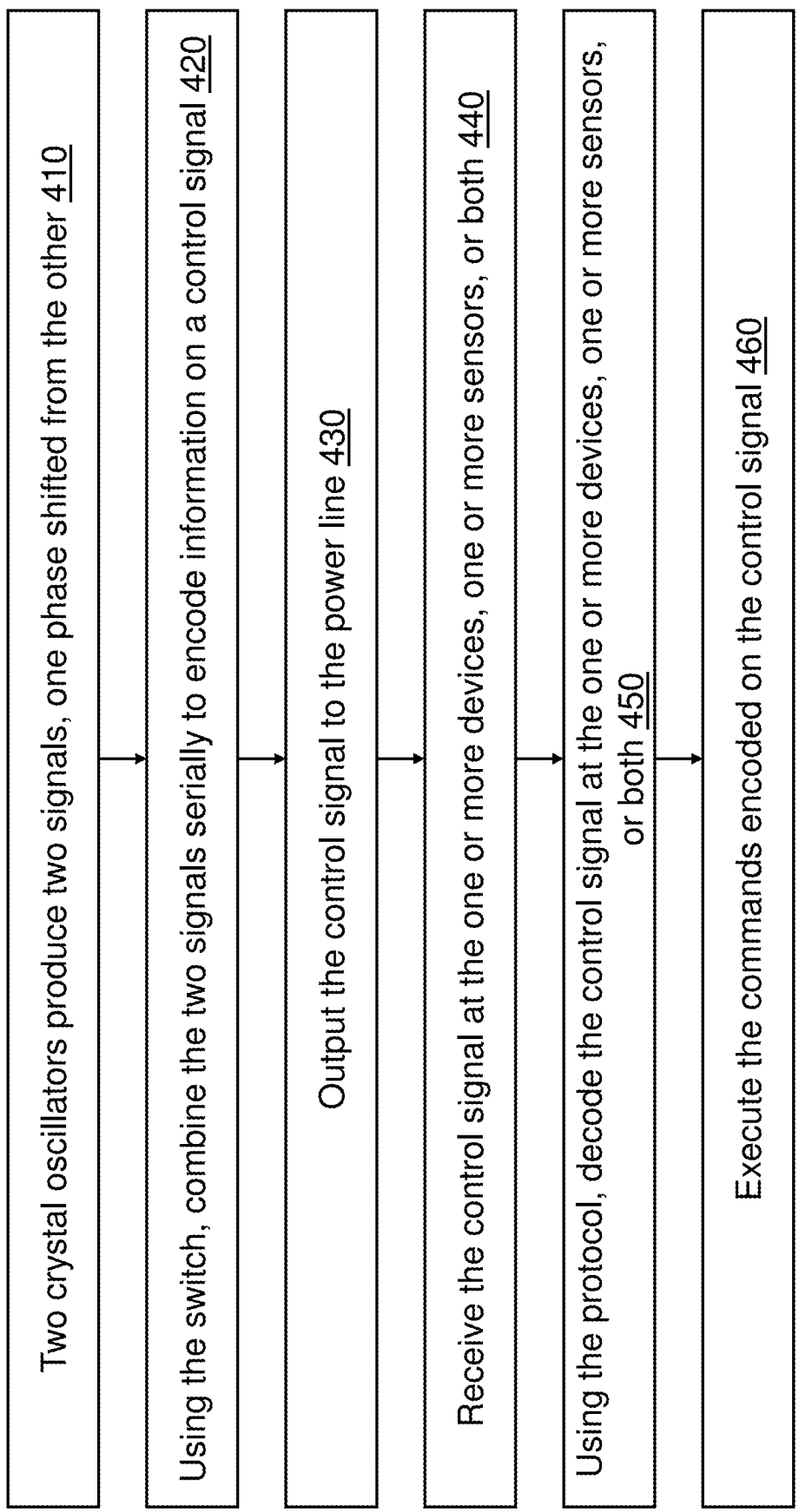
FIG. 2 shows a flowchart of a method of providing power line control.
Figure 3:
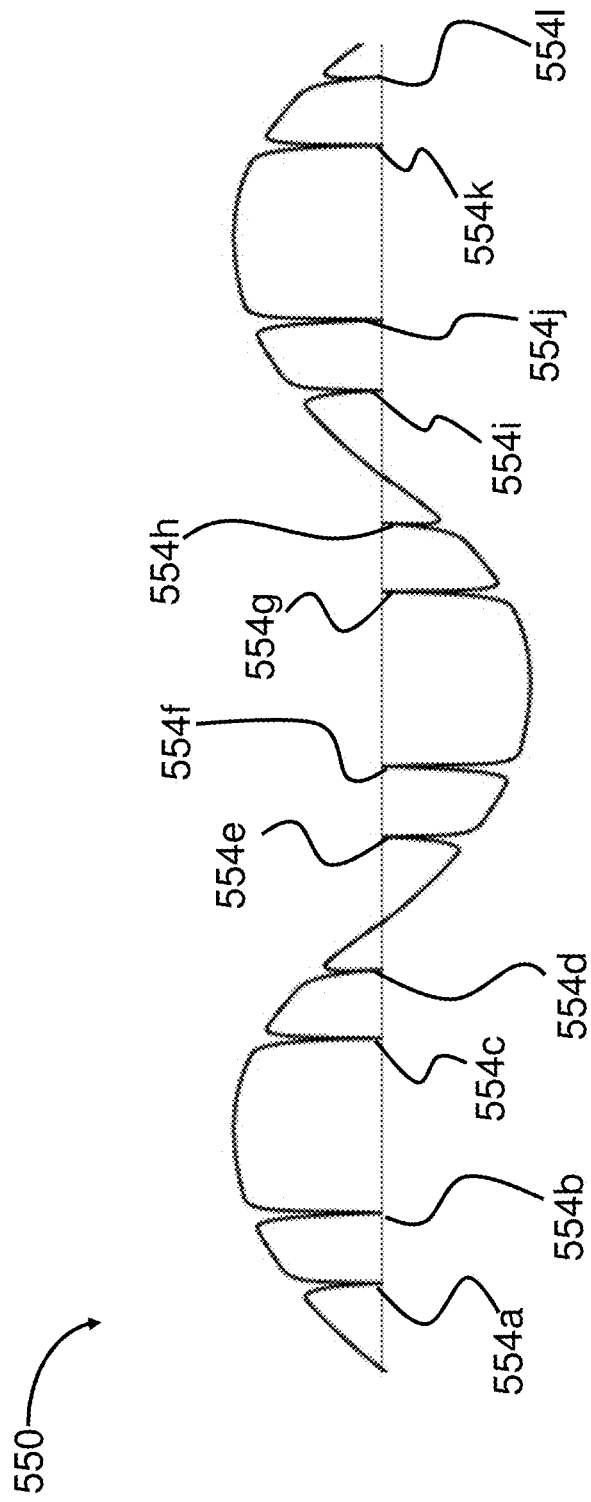
FIG. 3 shows a diagram of an emitter wave with information in the form of phase inversion spikes.

Once the control information is encoded on the sinusoidal wave generated by the crystal oscillator circuit 110, the control signal is output to the power line 112 as is shown in Step 430 of FIG. 2. The output is a broadcast throughout the power line 112. An exemplary control signal 550 is shown in FIG. 3. The sinusoidal wave that carries the control signal 550 includes a plurality of phase inversion spikes 554a-l. It will be noted that the phase inversion spikes 554a-l are placed at intervals along the sinusoidal wave to create the control signal 550, rather than one phase inversion spike 554a-l after another with no space in between. In some embodiments, there is no change in amplitude or frequency for the phase inversion spikes 554a-l; rather, only the phase is inverted.

On the receiving end, the control signal 550 is received on the crystal filter of the smart fan transceiver 126a-k as is shown in Step 440 of FIG. 2. The crystal filter filters out all of the signal on the power line except a bandwidth of 500 Hz or less centered on the transmission frequency of the crystal oscillator. Naturally, the rest of the signal on the power line may be band passed so that the power on the power line may be used to power the smart fan. The 500 Hz or less bandwidth captures the control signal because the phase inversions do little to spread the bandwidth of the original sinusoidal wave generated by the crystal oscillator. That is to say, the signal is not frequency modulated. The sinusoidal wave is generated and then phase inverted at intervals, rather than being a carrier wave that is then either frequency or amplitude modulated. Thus, the sinusoidal wave's very high Q factor, in the $10^5$ or $10^6$ range, is retained, which shows that the control signal includes the sinusoidal wave's narrow bandwidth. The protocol stored on a memory 134a-k, and executing on a processor 136a-k on the smart fan 130a-k detects and analyzes the information in the control signal 550. The control information encoded on the control signal 550 may be decoded and converted by the protocol as is shown in Step 450 of FIG. 2. The conversion may result in instructions which are executable to control the fan motor 138a-k as is shown in Step 460 of FIG. 2.

The use of phase inversion and the spacing thereof in the control signal provides further robust protection against interference by electrical noise on the power line 112. In order for electrical noise on the system to interfere with the control signal the electrical noise would need to invert its phase as the control signal 550 does. This kind of rapid phase inversion is uncommon in electrical noise, including the noise typically found on power lines. Thus, in addition to all the other ways the system 100 eliminates electrical noise which may affect the control signal 550, even the manner in which the control signal 550 is added to the sinusoidal wave generated by the crystal oscillator circuit provides robustness against interference by electrical noise.

The timing for phase inversions may be set to a fractional portion of the wave cycle of the crystal oscillator frequency by the protocol. Thus, where a phase inversion spike 554a-l appears on the sinusoidal wave carrying the control signal 550, the protocol may interpret the phase inversion spike 554a-l as indicative of a first binary state, while uninterrupted portions of the sinusoidal wave are interpreted as a second binary state. In this way, the protocol may interpret the control signal as a series of binary states, with the binary states representing either a one or a zero. Commands may be defined by the protocol from differing sequences of ones and zeros, or binary sequences.

Sequences of ones and zeros may form data or commands that can be analyzed and converted by the protocol. As an example, the smart fans may identify themselves using a binary code of a set number of digits. The identification may be a shorter or longer sequence than those of the commands. The protocol may define a preliminary indicator which indicates the start of a command or data string, and a second indicator which indicates the command or data send is complete and requests that the smart fan or fans to which the command was directed send an acknowledgement. Similarly, the protocol may use binary sequences to define commands. For example, the protocol may define that "1001" may correspond to a command to turn a smart fan 130a-k to full speed, while "1000" may correspond to a command to turn the smart fan 130a-k off. The data and commands may be packaged as messages that include the preliminary indicator that a command or data follows, headers which identify to which fans the command is directed, the command, and an indicator that the command is complete and a request for acknowledgement of the command by the smart fan.

Based on the command encoded in the control signal 550, the smart fan 130a-k to which the control signal command was directed may, for example, make an adjustment or power off. Additionally, the smart fan 130a-k may contemporaneously send an acknowledgement of the command back to the emitter 104. The receiver portion of the emitter 104 receives the acknowledgement, and, accordingly, does not resend the command. In the event that the emitter 104 does not receive the acknowledgement, the protocol directs the emitter 104 to send the command again after a predetermined time interval. This pattern continues until the acknowledgement is received from the smart fan or fans 130a-k given the command.

Below are a number of nonlimiting example embodiments described above.

In a 1st Example, a system for controlling devices via power line control, comprising: a controller which sends commands indicative of a user's operation of the controller; an emitter electrically connected to the controller, the emitter including: a crystal oscillator, the crystal oscillator being powered to transmit a sinusoidal wave at a transmission frequency; a switch electrically connected to the crystal oscillator, the switch operating at a cycle of at least fifty times the frequency of the crystal oscillator; a phase inversion circuit electrically connected to a first side of the switch; a bypass electrically connected to a second side of the switch; an output electrically connected to both the phase inversion circuit and the bypass; a first processor electrically connected to the switch, the first processor executing commands sent by the controller in order to operate the switch; and a first memory electrically connected to the processor, the first memory having a protocol stored on it; a power line electrically connected to the output, the power line carrying standardized electrical power of at least 100V and at least 40 Hz; one or more electrical outlets electrically connected to the power line; and one or more smart fans, one smart fan electrically connected to each of the one or more electrical outlets, the one or more smart fans including: a receiver including a crystal filter which passes a bandwidth centered around the transmission frequency; a second memory containing the protocol; and a second processor electrically connected to the second memory and the receiver, the second processor executing the protocol based on a control signal; wherein, when commands are sent from the controller, the first processor operates the switch according to the protocol, adding phase inversion spikes to the sinusoidal wave, the resulting control signal being sent on the power line and received by the receiver on the one or more smart fans and analyzed according to the protocol in order to operate the one or more smart fans.

In a 2nd Example, the system of Example 1, wherein the system includes two or more smart fans, but the commands from the controller is directed to only one of the two or more smart fans.

In a 3rd Example, the system of any of Examples 1-2, wherein the switch may provide 50 or more phase inversion spikes per cycle of the sinusoidal wave.

In a 4th Example, the system of any of Examples 1-3, wherein the crystal oscillator is a quartz crystal oscillator.

In a 5th Example, the system of Example 4, wherein the Q factor of the crystal oscillator is in the range of 105 to 106.

In a 6th Example, the system of Example 5, wherein the sinusoidal wave is output with one watt of power.

In a 7th Example, the system of any of Examples 1-6, wherein the protocol interprets the phase inversion spikes as a one and the absence of a phase inversion spike as a zero, or interprets the phase inversion spikes as a zero and the absence of a phase inversion spike as a one.

In a 8th Example, a method for providing power line control, comprising: generating a sinusoidal wave using a crystal oscillator; forming a control signal by operating a switch which routes the sinusoidal wave through a phase inversion circuit and back to a bypass according to a protocol, the routing and return to bypass forming phase inversion spikes at predetermined intervals on the sinusoidal wave; outputting the control signal to a power line; receiving the control signal on a crystal filter electrically connected to the power line; converting the control signal to executable instructions using the protocol; and controlling the operation of a fan motor based on the converted control signal.

In a 9th Example, the method of Example 8, wherein the crystal oscillator is a quartz crystal oscillator.

In a 10th Example, the method of Example 9, wherein sinusoidal wave has one watt of power.

In a 11th Example, the method of any of Examples 8-10, wherein the switch may provide 50 or more phase inversion spikes per cycle of the sinusoidal wave.

In a 12th Example, the method of any of Examples 8-11, wherein the Q factor of the crystal oscillator is in the range of 105 to 106.

In a 13th Example, a system for providing power line control, comprising: a controller which send commands externally of itself; an emitter electrically connected to the controller, the emitter including a crystal oscillator which emits a sinusoidal wave, a switch electrically connected on a first end to the crystal oscillator and electrically connected on a first side of a second end to a bypass and on a second side of the second end to a phase inversion circuit, a first memory containing a protocol, a first processor electrically connected to the switch and the first memory, the first processor executing the protocol according to the commands from the controller, and an output; a power line connected to the output; and at least one smart fan electrically connected to the power line, the at least one smart fan including a crystal filter, a second processor electrically connected to the crystal filter and a fan motor, a second memory electrically connected to the second processor, the second memory containing the protocol; wherein, when a user operates the controller to send a command, the protocol, executing on the first processor, converts the command to control information and encodes the sinusoidal wave with the control information in the form of phase inversion spikes and spacing between the spikes, the sinusoidal wave with control information being output to the power line and received at the crystal filter, analyzed by the protocol executed on the second processor, and converted to instructions for controlling the fan motor.

In a 14th Example, the system of Example 13, wherein the system includes at least two smart fans, but the at least two smart fans may be sent commands individually.

In a 15th Example, the system of any of Examples 13-14, wherein the switch may provide 50 or more phase inversion spikes per cycle of the sinusoidal wave.

In a 16th Example, the system of any of Examples 13-15, wherein the crystal oscillator is a quartz crystal oscillator.

In a 17th Example, the system of Example 16, wherein the Q factor of the crystal oscillator is in the range of 105 to 106.

In a 18th Example, the system of Example 17, wherein the sinusoidal wave is output with one watt of power.

In a 19th Example, the system of any of Examples 13-18, wherein the emitter operates the crystal oscillator between series and parallel resonance.

In a 20th Example, the system of any of Examples 13-19, wherein the emitter operates the crystal oscillator at series resonance.

The above description is given by way of example, and not limitation. Given the above disclosure, one skilled in the art could devise variations that are within the scope and spirit of the invention disclosed herein, including various ways of defining the commands in the protocol. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A system for controlling devices via power line control, comprising:
    a controller which sends commands indicative of a user's operation of the controller;
    an emitter electrically connected to the controller, the emitter including:
        a crystal oscillator, the crystal oscillator being powered to transmit a sinusoidal wave at a transmission frequency;
        a switch electrically connected to the crystal oscillator, the switch operating at a cycle of at least fifty times the frequency of the crystal oscillator;
        a phase inversion circuit electrically connected to a first side of the switch;
        a bypass electrically connected to a second side of the switch;
        an output electrically connected to both the phase inversion circuit and the bypass;
        a first processor electrically connected to the switch, the first processor executing commands sent by the controller in order to operate the switch; and
        a first memory electrically connected to the processor, the first memory having a protocol stored on it;
    a power line electrically connected to the output, the power line carrying standardized electrical power of at least 100V and at least 40 Hz;
    one or more electrical outlets electrically connected to the power line; and
    one or more smart fans, one smart fan electrically connected to each of the one or more electrical outlets, the one or more smart fans including:
        a receiver including a crystal filter which passes a bandwidth centered around the transmission frequency;
        a second memory containing the protocol; and
        a second processor electrically connected to the second memory and the receiver, the second processor executing the protocol based on a control signal;
    wherein, when commands are sent from the controller, the first processor operates the switch according to the protocol, adding phase inversion spikes to the sinusoidal wave, the resulting control signal being sent on the power line and received by the receiver on the one or more smart fans and analyzed according to the protocol in order to operate the one or more smart fans.

2. The system of claim 1, wherein the system includes two or more smart fans, but the commands from the controller is directed to only one of the two or more smart fans.

3. The system of claim 1, wherein the switch may provide 50 or more phase inversion spikes per cycle of the sinusoidal wave.

4. The system of claim 1, wherein the crystal oscillator is a quartz crystal oscillator.

5. The system of claim 4, wherein the Q factor of the crystal oscillator is in the range of $10^5$ to $10^6$.

6. The system of claim 5, wherein the sinusoidal wave is output with one watt of power.

7. The system of claim 1, wherein the protocol interprets the phase inversion spikes as a one and the absence of a phase inversion spike as a zero, or interprets the phase inversion spikes as a zero and the absence of a phase inversion spike as a one.

8. A method for providing power line control, comprising:
    generating a sinusoidal wave using a crystal oscillator;
    forming a control signal by operating a switch which routes the sinusoidal wave through a phase inversion circuit and back to a bypass according to a protocol, the routing and return to bypass forming phase inversion spikes at predetermined intervals on the sinusoidal wave;
    outputting the control signal to a power line;
    receiving the control signal on a crystal filter electrically connected to the power line;
    converting the control signal to executable instructions using the protocol; and
    controlling the operation of a fan motor based on the converted control signal.

9. The method of claim 8, wherein the crystal oscillator is a quartz crystal oscillator.

10. The method of claim 9, wherein sinusoidal wave has one watt of power.

11. The method of claim 8, wherein the switch may provide 50 or more phase inversion spikes per cycle of the sinusoidal wave.

12. The method of claim 8, wherein the Q factor of the crystal oscillator is in the range of $10^5$ to $10^6$.

13. A system for providing power line control, comprising:
    a controller which send commands externally of itself;
    an emitter electrically connected to the controller, the emitter including a crystal oscillator which emits a sinusoidal wave, a switch electrically connected on a first end to the crystal oscillator and electrically connected on a first side of a second end to a bypass and on a second side of the second end to a phase inversion circuit, a first memory containing a protocol, a first processor electrically connected to the switch and the first memory, the first processor executing the protocol according to the commands from the controller, and an output;

a power line connected to the output; and at least one smart fan electrically connected to the power line, the at least one smart fan including a crystal filter, a second processor electrically connected to the crystal filter and a fan motor, a second memory electrically connected to the second processor, the second memory containing the protocol;

wherein, when a user operates the controller to send a command, the protocol, executing on the first processor, converts the command to control information and encodes the sinusoidal wave with the control information in the form of phase inversion spikes and spacing between the spikes, the sinusoidal wave with control information being output to the power line and received at the crystal filter, analyzed by the protocol executed on the second processor, and converted to instructions for controlling the fan motor.

14. The system of claim 13, wherein the system includes at least two smart fans, but the at least two smart fans may be sent commands individually.

15. The system of claim 13, wherein the switch may provide 50 or more phase inversion spikes per cycle of the sinusoidal wave.

16. The system of claim 13, wherein the crystal oscillator is a quartz crystal oscillator.

17. The system of claim 16, wherein the Q factor of the crystal oscillator is in the range of $10^5$ to $10^6$.

18. The system of claim 17, wherein the sinusoidal wave is output with one watt of power.

19. The system of claim 13, wherein the emitter operates the crystal oscillator between series and parallel resonance.

20. The system of claim 13, wherein the emitter operates the crystal oscillator at series resonance.

\* \* \* \* \*